United States Patent [19]

Crawford

[11] Patent Number: 4,709,344
[45] Date of Patent: Nov. 24, 1987

[54] PROGRAMMABLE MULTIFREQUENCY DIGITAL TONE RECEIVER

[75] Inventor: Robert J. Crawford, Elgin, Ill.

[73] Assignee: Motorola, Inc., Schaumburg, Ill.

[21] Appl. No.: 782,786

[22] Filed: Oct. 2, 1985

[51] Int. Cl.[4] .................. G06F 7/38; G06F 15/31
[52] U.S. Cl. ................................................ 364/724
[58] Field of Search ........ 364/724, 736, 200 MS File; 370/8, 19, 70, 110.2, 110.3; 375/25, 75, 103

[56] References Cited

U.S. PATENT DOCUMENTS

| Re. 29,460 | 10/1977 | Mills | 370/110.3 X |
|---|---|---|---|
| 3,824,471 | 7/1974 | Mills | 370/110.3 X |
| 3,863,030 | 1/1975 | Mills | 370/110.3 |
| 4,221,934 | 9/1980 | Schiff | 370/70 X |
| 4,354,248 | 10/1984 | Conger et al. | 364/724 |
| 4,393,456 | 7/1983 | Marshall | 364/724 |
| 4,394,762 | 7/1983 | Nabeshima | 375/25 X |

FOREIGN PATENT DOCUMENTS

3118473  11/1982  Fed. Rep. of Germany .

Primary Examiner—Gary V. Harkcom
Assistant Examiner—Tan V. Mai
Attorney, Agent, or Firm—Robert J. Crawford

[57] ABSTRACT

A circuit arrangement for filtering input signals carried on PCM channels. The circuit arrangement includes a plurality of digital signal processors arranged in a parallel manner each having a set of filtering operations, a multiplexer for distributing the input signals to each digital signal processor, a processor for analyzing frequency characteristics output by the digital signal processors and an addressing PROM for controlling a correspondence between the PCM channels and the filtering operations in each of the digital signal processors.

25 Claims, 7 Drawing Figures

Fig. 1

PRIOR ART

Fig. 2

PRIOR ART

PROGRAMMABLE MULTIFREQUENCY DIGITAL TONE RECEIVER

BACKGROUND OF THE INVENTION

The present invention relates to tone receivers for communication systems, and more particularly, to multifrequency tone receivers especially adapted for use in pulse code modulation (PCM) communication systems.

In prior art configurations, tone receivers have typically been of the analog type since both speech signals and supervisory tone signals have been transmitted over communication channels in analog form. Because digital techniques provide very high quality signal transmission which is not degraded over long distances, communication systems have recently adopted digital transmission techniques such as PCM. Accordingly, since both speech signals and supervisory tone signals are digitally encoded in such communication systems, a digital tone receiver is preferable over a conventional analog tone receiver.

There are, of course, digital tone receivers known in the art of one type or another. One such receiver apparatus is set forth and described in U.S. Pat. No. 4,354,248, Conger et al., assigned to the same assignee as the present invention. As therein disclosed, a microprogrammed sequence controller is utilized with a time multiplex digital filter and a signal processing microcomputer for filtering digital signals. By controlling input signal samples off the PCM data bus through the time multiplex digital filter, the controller causes the samples to be processed by the microcomputer in a pipeline-like fashion.

A typical application of the above referenced receiver apparatus is the detection of multifrequency tone signals such as those utilized for supervisory signalling in communication systems. In telephony applications, supervisory signals include dial tone, busy, off-hook, etc. These signals are comprised of two frequencies, requiring that the receiver apparatus filter two frequencies at the PCM channel carrying the signal. By sequentially extracting digital samples representative of those frequencies from the input signal, the samples are sequenced through specific filter operations located within the time multiplexed digital filter. The sequential manner in which the digital samples are filtered limits the number of PCM channels that can be handled. This is due to the pipeline-like architecture of this receiver apparatus.

Additionally, communication systems often require applications using multiple signalling schemes. Signalling schemes, such as DTMF or MF, are required for telephony reception. One application may be to configure the system for customer phone usage. In this instance, DTMF may be the required signalling scheme. At a particular time of day, an application may require that tests be executed for remote peripherals, such as a base station transmitter. Often this type of periodic testing demands an alternate signalling scheme, or a special test tone. In a cellular communication system, it is often desirable to remotely test a mobile telephone. This is typically done by transmitting a special test tone from the mobile to a receiver apparatus in the communication system. The special test tone is selected such that it will not interfere with other frequencies from the standard signalling schemes. Although the test tone is used very infrequently, prior art configurations require that a separate receiver apparatus be used for filtering the special test tone.

Typically, digital receiver circuits are arranged in parallel, each designated to a particular signalling scheme. Each circuit independently accesses a PCM data bus with each receiver assigned to each PCM channel. The channels are specified by hard wired addressed lines connected to each circuit. In order to change from one signalling scheme to another, the active receiver circuit must be disabled. This is usually done by toggling an enable signal, wired along the PCM bus, to each card. Conversely, the other receiver circuit is then enabled by toggling its enable signal. This can be very costly as well as potentially unreliable. The cost is incurred by the redundant circuitry of the inactive receiver circuits. The reliablilty loss occurs when one receiver circuit experiences a fault and loads the PCM data bus. For a system with a large number of such receiver circuits, it is extremely difficult to analyze which receiver circuit is actually causing the difficulty. If the difficulty delays reception, the entire system experiences down-time.

This reliability problem has been addressed in prior art by employing a back-up set of receiver ciruits. Each set defines a subsystem. This allows the communication system to redundantly switch from one such subsystem to another when a fault is detected. A major disadvantage of this type of configuration is, again, the cost of the redundant circuitry. This extra cost includes periodic testing and maintenance of the redundant equipment.

A circuit arrangement is needed to overcome the problem of reliability without introducing excessive costs. Additionally needed is a receiver arrangement that can accommodate a variety of signalling schemes, dependent upon system requirements.

OBJECTS AND SUMMARY OF THE INVENTION

Accordingly, it is an object of the present invention to provide a circuit arrangement for filtering input signals which can accommodate a variety of signalling schemes.

It is another object of the present invention to provide a circuit arrangement for filtering input signals which is tolerant of circuitry failure.

It is another object of the present invention to provide a circuit arrangement for filtering input signals which utilizes less circuitry than those circuit arrangements known in the art.

It is a further object of the present invention to provide a circuit arrangement for filtering input signals which includes a significantly faster process than heretofore known for detecting multifrequency signals.

It is a further object of the present invention to provide a circuit arrangement for filtering input signals for testing the integrity of the PCM data bus which it is utilizing for the input signals.

It is a further object of the present invention to provide a circuit arrangement for filtering input signals which greatly reduces the number of interconnects required at the PCM bus, thereby substantially increasing its reliability.

It is yet another object of the present invention to provide a circuit arrangement for filtering input signals which may be manufactured and maintained at a greatly lowered cost.

In practicing the invention, a circuit arrangement is provided for filtering input signals in a PCM channel system. The arrangement includes a plurality of digital signal processors arranged in parallel, each responsive to a start signal for receiving an input signal and each providing an output signal upon completion of one or more filtering operations. The input signals are distributed to the digital signal processors by a multiplexer. This distribution establishes a correspondence between the PCM channels and the filter operations used by the digital signal processors. Another processor is used to analyze the output signals for frequency characteristics of the input signals which are output from the digital signal processors. The correspondence between the PCM channels and the filter operations is preferably controlled by programmable logic, such as a bipolar PROM.

DETAILED DESCRIPTION OF THE PREFERRED EMBODIMENT

Figure 1:
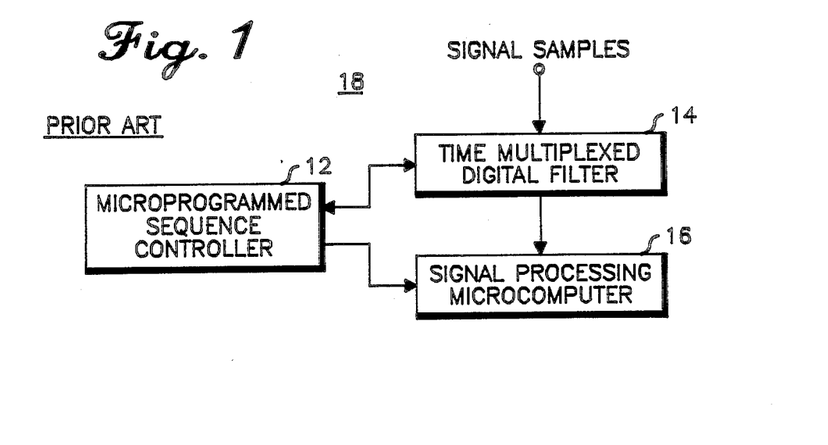
FIG. 1 is a block diagram of a prior art receiver arrangement.

Referring now to the drawings, a block diagram of a prior art receiver circuit 18 is shown in FIG. 1. As indicated, the circuit includes a microprogrammed sequence controller 12 for controlling timing between a time multiplexed digital filter 14 and a signal processing microcomputer 16. PCM signal samples are sequentially processed through the time multiplexed digital filter 14 for specific filtering operations. The time multiplexed digital filter 14 outputs signals to the signal processing microcomputer 16, which analyzes these output signals for miscellaneous frequency characteristics, such as: momentary absence of significant energy in the PCM samples, indication that more than one frequency is present, a skew between two frequencies present, a twist or a level difference between two frequencies being present, whether the energy levels, as indicated by the output signals, fall within a predetermined range, etc. The time multiplexed digital filter 14 is dedicated to a set of filtering operations which designate a signalling scheme or a generic set of frequencies to be filtered. Its incorporation into one type of communication system is shown in FIG. 2.

Figure 2:
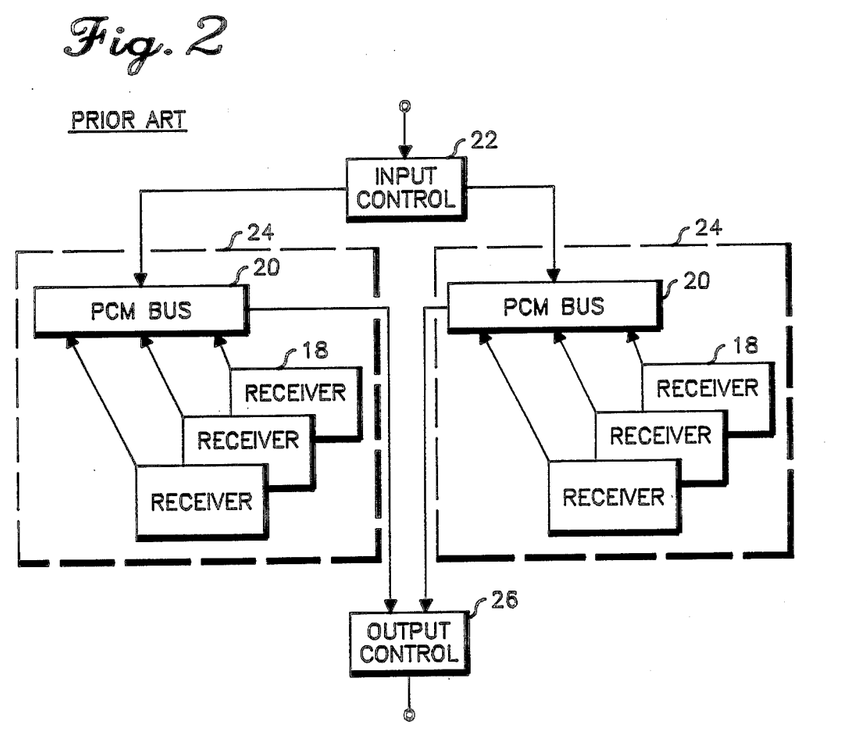
FIG. 2 is a typical prior art configuration of two receiver arrangement subsystems.

Referring to FIG. 2, two subsystems 24 are shown, each including a number of receiver circuits such as that referenced in FIG. 1. Each subsystem 24 accesses a separate PCM data bus 20. Input control 22 selectively distributes the PCM data to each subsystem. The input control 22 usually includes (but not specifically shown) a microprocessor, miscellaneous (synchronization) circuitry, address signals and activation control for each receiver circuit 18. Output control 26, comprised of elements very similar to the input control 22, selectively accesses the PCM data bus for a formatted summary of frequencies and frequency characteristics received on the PCM data bus.

The subsystems 24 are often used for two different applications. In one application, one subsystem 24 is used to redundantly support the other if a fault is detected. When a fault occurs on the PCM data bus 20 or within one of the receiver circuits 18, the output control 26 signals the communication system. The communication system then instructs the input control 22 to activate the redundant subsystem. Great care must be taken to prevent loss of PCM data during the transition to the redundant subsystem. The activation of the redundant subsystem is typically executed through hard-wired address lines along the PCM data bus 20. The individual receiver circuits 18 typically respond to the input signals only when their address is recognized on the PCM bus 20. Hence, by addressing only the redundant receivers, only the redundant subsystem is activated. Any signalling information being transferred through the subsystem 24 when a fault occurs should necessarily be switched over to the backup subsystem without losing any of the PCM data. Nevertheless, due to the complexity of such a transition, PCM data is often lost at this transition point.

The subsystem configuration of FIG. 2 is also used to define different groups of signalling schemes. For example, it may be desirable to configure one subsystem with all receiver circuits dedicated to MF signalling and the other subsystem with all receiver circuits dedicated to DTMF signalling. If at any particular instance, one group is preferred over the other, the input control 22 can selectively switch the active subsystem 24. This is often necessary when known types of system usage occur on a regular basis. As an example, on a cellular communication system, customer usage is known to be concentrated at midday and just after working hours.

Beyond the obvious cost problem and the fault tolerant problem previously mentioned, a structural problem with this configuration should be noted. Due to the sequential filtering of the PCM data in each receiver arrangement, many receiver circuits 18 are required to handle the large number of PCM channels in the communication system. Consequently, an additional reliability problem results. The problem is the interface between the PCM data bus 20 and each receiver arrangement 18. The interface typically requires a mechanical connector. Mechanical connectors are notorious for failures in most any system. The communication system referred to here is no exception.

The more receivers required, the more prone the system is to a failure. Accordingly, there is additionally a need for a receiver arrangement which significantly reduces the number of interconnects at the PCM data bus.

Figure 3:
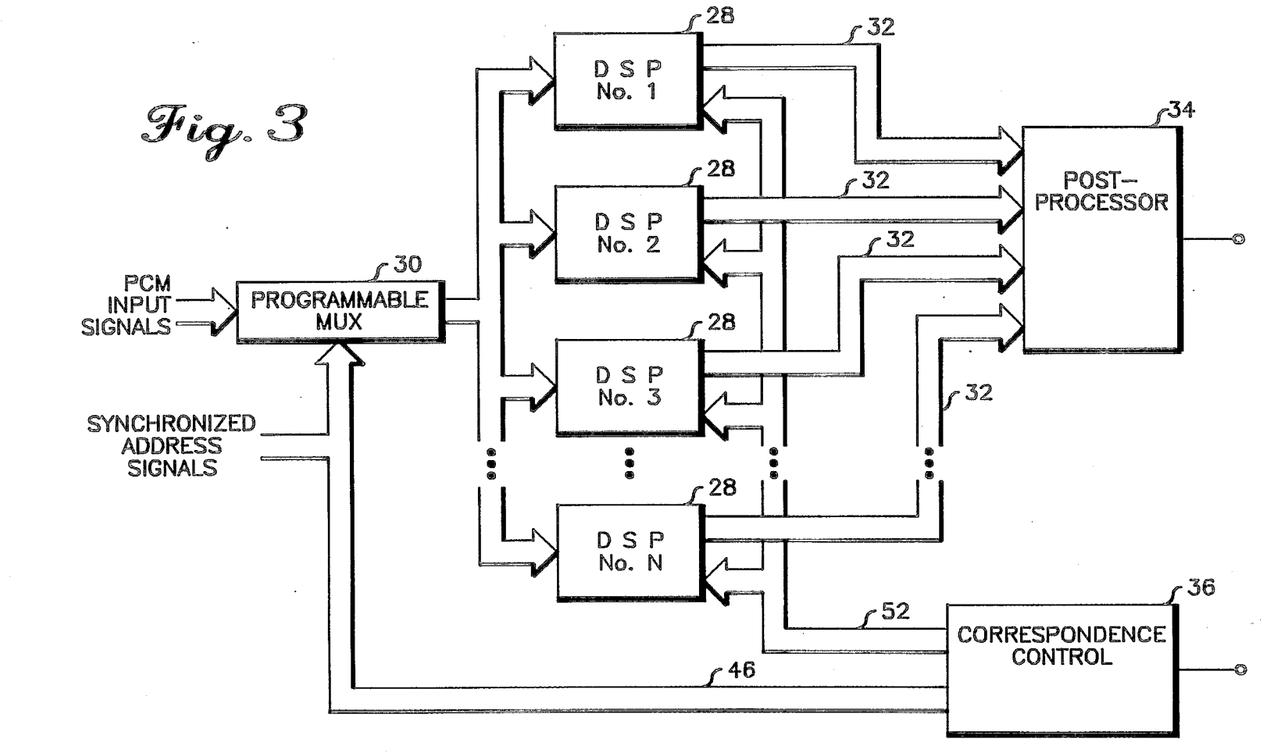
FIG. 3 is a block diagram of a circuit arrangement for filtering input signals, which circuit has been constructed in accordance with the present invention.

FIG. 3 is an improved circuit arrangement for filtering digital input signals, which has been constructed in accordance with the present invention. Each digital signal processor 28 (hereinafter referred to as DSP) is understood as including standard read-write memory, instruction memory, a FIFO for efficient outputting and a processor chip, such as the Texas Instrument part TMS32010. Filtering programs are stored for each processor chip in the instruction memory for executing a set of digital filter operations, such as bandpass, lowpass or highpass filter operations. The DSPs 28 are fed PCM input signals via a programmable multiplexer 30, such as a PAL type 10L8, available from Monolithic Memories, Inc. The multiplexer 30 is used to extract the input signals from the PCM bus and perform any manipulation of the data that may be required, such as a linear transformation of the PCM data. Address signals, or select signals at the input of the multiplexer 30 control the timing for the extraction of the input signals from the PCM bus, allowing the multiplexer 30 to synchronously distribute the input signals to each DSP 28. The input samples are routed to each DSP 28 for filtering according to a specific set of filtering operations, or a set of grouped instruction steps defining a filter operation. Filtering operations assigned to each DSP 28 establish the frequency range for which the digital samples are filtered. Each DSP 28 outputs a binary code 32 representing an energy level, as interpreted by each DSP. After a set of filtering operations is executed by one or more DSPs 28, a post-processor 34, such as Motorola type 68B09, extracts this information output from each DSP 28. The post-processor 34 analyzes the output information for frequency characteristics such as those previously mentioned and more specifically: the skew, or the time differential between two recognized tones, the twist, or the difference in energy level between two tones, any type of analysis regarding more than one tone being present, the disappearance or absence of a tone, whether the energy levels fall within a predetermined maximum and minimum level range, etc. These frequency characteristics are more specifically described in the Conger patent (supra).

Correspondence control, block 36, is shown which provides dynamic control to the DSPs 28 and the multiplexer 30. The minimum requirement for this control is to decode and latch a set of address signals. A bipolar PROM, such as Signetics type 82S123, handles this requirement quite well. Its function is to selectively control a correspondence established between the PCM channels and the filtering operations within the DSPs 28. The correspondence is established at each DSP 28 according to the PCM channel(s) assigned to each particular DSP 28 by the multiplexer 30. The multiplexer 30 routes input signals from the PCM bus to the DSPs 28, according to PCM channel numbers specified by the address signals. An illustration of this correspondence is given below.

| PCM channel no. | 1 2 3 | 4 5 6 | 7 8 9 | ... 24 |
|---|---|---|---|---|
| DSP no. | 1 | 2 | 3 | N |
| Filter Type | Band | High | Low | Notch |

The correspondence established here designates band pass filter operations to the first DSP. The first DSP handles only PCM channels 1, 2 and 3. A similar correspondence is established for DSPs 2 through N. It should be noted that the filter types are not restricted to those types listed above. For a communication system, a more common application would be to designate a signalling scheme to each DSP, such as MF or DTMF rather than a single filter type.

By connecting signals 46, latched at the output of the correspondence control 36, to address signals of the multiplexer 30, the correspondence established between a PCM channel and a specified DSP 28 can be altered. If each DSP contains different types of filtering operations, then by changing the correspondence between the PCM channel of the input signal and the specified DSP 28, the corresponding filtering operation is changed as well. For example, the preceding correspondence might change to the following.

| PCM channel no. | 1 6 7 | 2 3 4 | 5 8 9 | ... 24 |
|---|---|---|---|---|
| DSP no. | 1 | 2 | 3 | N |
| Filter Type | Band | High | Low | Notch |

If the filter types were changed to signalling schemes, as aforementioned, the above correspondence would appear as follows.

| PCM channel no. | 1 6 7 | 2 3 4 | 5 8 9 | ... 24 |
|---|---|---|---|---|
| DSP no. | 1 | 2 | 3 | N |
| Filter Type | Test | MF | DTMF | R2 |

Such a correspondence may be desirable if a test signal was suddenly received on channels 1, 6 and 7. In this instance, since DSP 1 has filtering operations to accommodate only the test tone, the correspondence control 36 would assign these PCM channels to DSP 1.

Another way to change this correspondence is to connect the outputs from the bipolar PROM constituting the correspondence control 36 to address signals 52 of the DSP instruction memory. If the instruction memory is set up to contain alternate filtering operations, then changing the address to a different set of operations changes the correspondence between the PCM channel of the input signal and the filtering operations of the DSP 28. For example, assume DSP 1 is set up with two sets of filtering operations, one for MF signalling and one for receiving the test tone. If test tones suddenly appeared at the PCM input signals on the first three PCM channels, a correspondence as follows:

| PCM channel no. | 1 2 3 | 4 5 6 | 7 8 9 | ... 24 |
|---|---|---|---|---|
| DSP no. | 1 | 2 | 3 | N |
| Filter Type | MF | MF | DTMF | R2 | would change to:

| PCM channel no. | 1 2 3 | 4 5 6 | 7 8 9 | ... 24 |
|---|---|---|---|---|
| DSP no. | 1 | 2 | 3 | N |
| Filter Type | Test | MF | DTMF | R2 |

The advantage of this arrangement is that only one DSP 28 is required to accommodate filtering operations for the special test tone. Any PCM channel which carries the test tone may be received without every DSP 28 having filtering operations required to receive the test tone.

These different situations occur regularly on a typical communication system. They are typically handled by an excessive number of receiver arrangements, each designated to one set of filtering operations. Other applications may include one DSP testing for background noise on particular PCM channels, and another DSP testing for supervisory signals.

Another advantage of controlling the correspondence between the input signals and the filtering operations is the fault tolerance it provides. Often faults occur at the PCM backplane or within a DSP. These faults are usually caused by a hardware failure, such as a wireshort, an interconnect fault, an IC falsely loading a bus, etc. Regardless of what causes the fault, this control can be used to isolate the fault to a particular PCM channel or DSP. If it is determined that input signal information is unintelligible, a routine can be executed using the output of the correspondence control to change to different DSPs 28 or different PCM channels. The routine would be structured as follows:

```
For each channel i and for each DSP n
Do i = 1 through j (j channels total)
Do n = 1 through m (m DSPs total)
Route channel i to DSP n
If unintelligible signals are received
Then record i and n
Else continue
End
End
If any channel i is recorded more than once
Then report that channel as inoperable
Else continue
If any DSP n is recorded more than once
Then report that DSP as inoperable
Return
```

Accordingly, each channel is checked against each DSP for validity. If a single fault exists on either a PCM channel or in a DSP, it is identified in the recording process. Any i that is recorded for two or more n's identifies a faulty PCM channel. Any n that is recorded for two or more i's, identifies a faulty DSP. The particular channel or DSP that is identified as being faulty is taken out of service. Input signals routed through that particular circuitry are rerouted via the correspondence control block 36. Using such a method in accordance with the circuit arrangement of FIG. 3, realizes a fault tolerant circuit arrangement.

The input signals to the correspondence control can be sourced from within the post-processor 34, allowing automatic control and reassignment capabilities through feedback. A simpler mechanism for controlling the inputs to the correspondence control is to manually control them through a switch. In fact, if a switch is used, the address signals to the multiplexer 30 or to the DSPs 28 can be directly connected from the switch. An IC, such as the previously identified type 82S123, would not be required. Though manual control is not highly desirable, it is often the simplest and can easily be implemented on the PC board containing this circuit arrangement.

Figure 4:
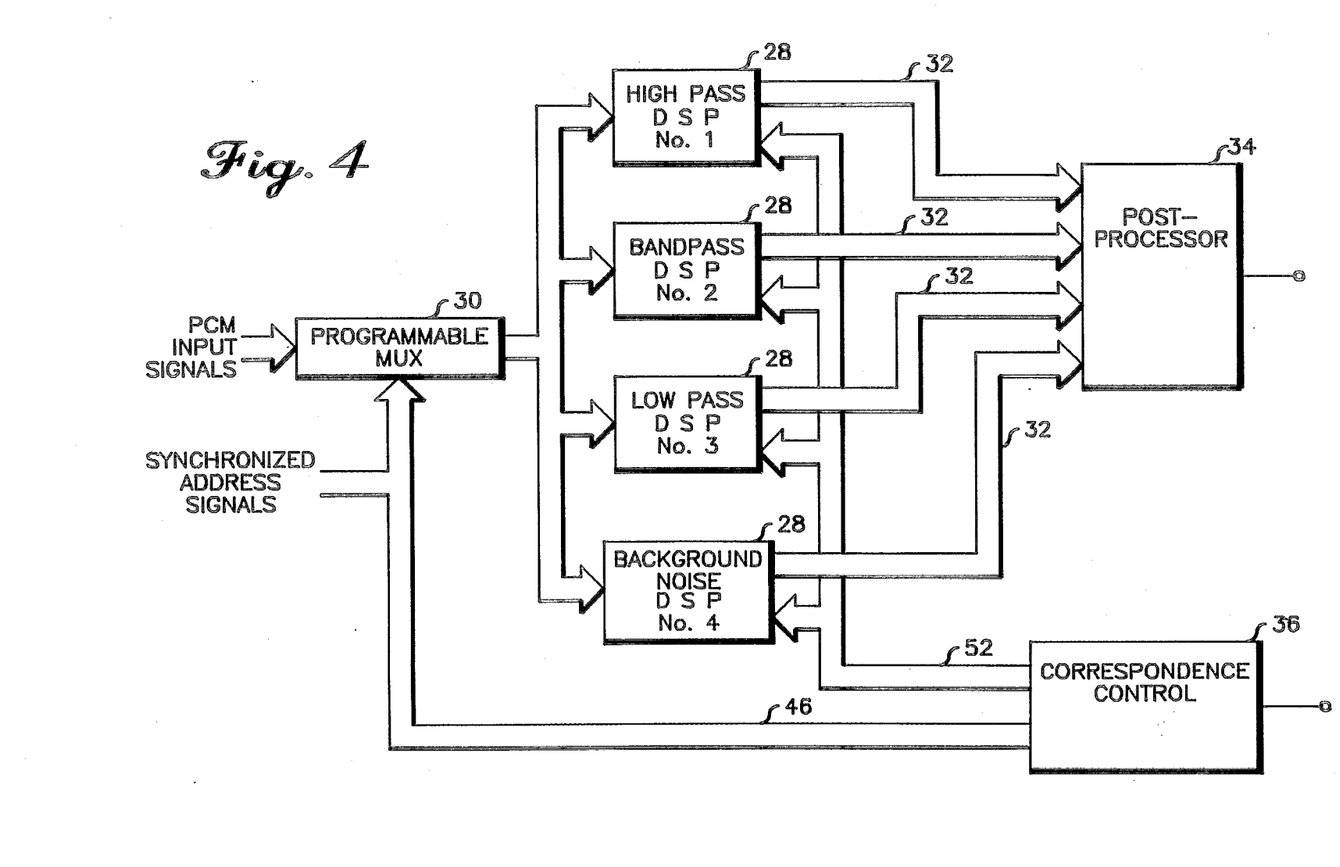
FIG. 4 is the circuit arrangement of FIG. 3 shown for specific application to high speed digital reception of a single PCM channel.

Referring now to FIG. 4, a specific application of this circuit arrangement is illustrated. The referenced application is referred to as "high speed frequency recognition". Each DSP 28 is assigned a specific set of filtering operations for one particular tone at one PCM channel. The first DSP 28 is assigned filtering operations defining a high pass filter. The second DSP 28 is assigned filtering operations defining a bandpass filter. The third DSP 28 is assigned filtering operations defining a low pass filter. The fourth DSP 28 determines the amount of background noise present across the entire frequency spectrum. Arranging the filter operation assignments in this manner allows the post-processor 34 to analyze energy levels from the DSPs 28 significantly faster than any sequential manner. Typically, filtering operations pertaining to each channel are executed one at a time by a single DSP 28. In this application, by using only the second DSP 28 to output a signal representing the energy level of the tone detected, the other DSPs 28 can be used solely to alert the post-processor 34 if an abnormal condition is present, such as undesired tones present outside the desired band under analysis. For example, let DSP 2 output energy levels for only those frequencies around 1280 Hz. Let DSP 1 output an alert code, or a flag, when it detects energy levels that are greater than 1288 Hz. Let DSP 3 output a flag when it detects energy levels that are less than 1272 Hz. Then as input signals are being processed by each DSP for the PCM channel, the post-processor 34 is required to make only a minimal determination that energy exists around 1280 Hz. The post-processor 34 relies on the other DSPs to flag if energy levels are detected outside the 1280 Hz. band. The post-processor can be flagged by polling the output signals from the other DSPs or by an interrupt method. Accordingly, by distributing these filtering responsibilities throughout the various DSPs, rather than concentrating them in the post-processor 34, faster processing times can be realized.

Another increase in filtering speed can be realized in a way similar to that described in FIG. 4. If the responsibility of analyzing the frequency characteristics was offset from the post-processor 34 to one or more of the DSPs 28, the time which is normally required to analyze the frequency characteristics is substantially reduced. One DSP 28 can alert the processor 34 if excessive noise is present. Another DSP 28 can alert the post-processor 34 if an energy level is reached from an undesirable frequency range. Another DSP 28 can alert if the presence of the desired tone disappears for a predetermined amount of time, etc. The distribution of functions that each DSP 28 can be assigned is practically unlimited. Considering the ability to dynamically reconfigure into such an arrangement, great flexibility is realized according to the immediate needs of the communication system.

Figure 5:
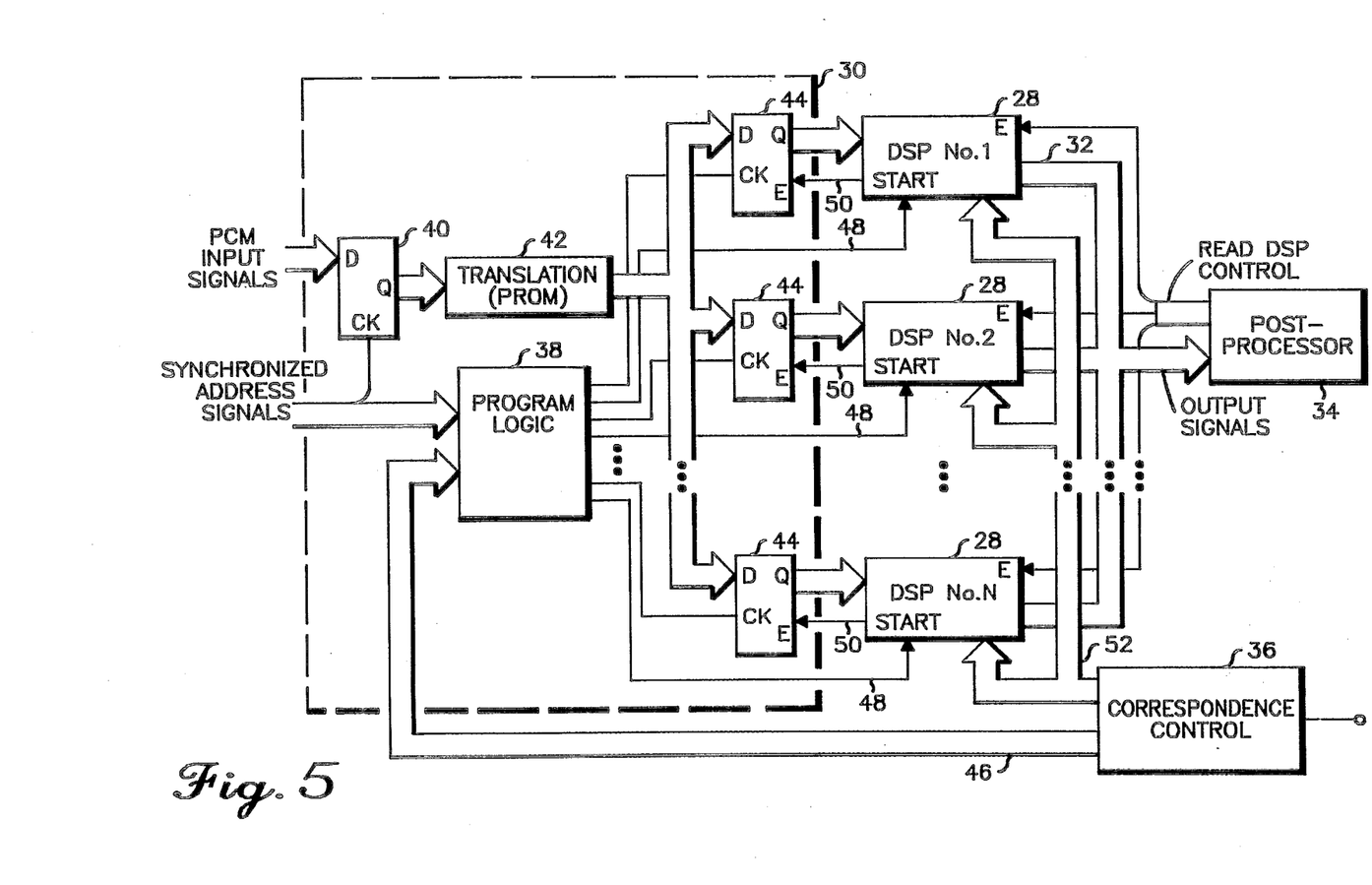
FIG. 5 is the circuit arrangement of FIG. 3, with detail showing signalling control between the major blocks and specific implementation within the multiplexer.

FIG. 5 is a more detailed block diagram than that shown in FIG. 3. Detail is specifically shown for the multiplexer 30. The multiplexer 30 includes programmable logic 38, such as the previously mentioned type 1018 PAL for multiplexing; octal latches 40, such as the type JEDIC 74374, for latching the input signals; translation means 42, such as a pair of $512 \times 8$ EPROMs, for converting the PCM input signals to linear form; and additional octal latches 44 for holding the information until it is extracted by the DSPs 28. Input to the programmable logic 38 includes synchronized address signals which control the distribution of each digital sample of the input signals. Alternate address signals, or select signals 46, are shown which are sourced by the correspondence control, block 36, allowing the PCM channels to be reassigned to each DSP 28, as previously discussed. After being translated into linear form, a digital sample of the input signal is latched 44 according to an output signal defined within the programmable logic 38. This is indicated by 'CK' within the 74374, latch 44. A start signal 48 is supplied by the multiplexer 30 which indicates to the DSP 28 that a digital sample is ready. The DSP 28 then extracts the digital rample from the latch 44 by a request line 50 to the latch 44. The digital sample is next passed to the DSP 28 for filtering according to one or more K cascaded M-order filtering operations, where K and M are integer numbers greater than one. This particular type of filtering operation is discussed in the Conger patent, supra.

Alternate address signals, or select signals 52, are shown as inputs to the DSPs 28 which allow the programmed filtering operations to be changed, as discussed previously. After the DSP 28 executes a set of filtering operations on the digital sample, it outputs the result to the FIFO (not shown). When the FIFO is full, the post-processor 34 extracts this data for analysis of related frequency characteristics by enabling the DSP 28 through the use of a select signal.

Figure 6A:
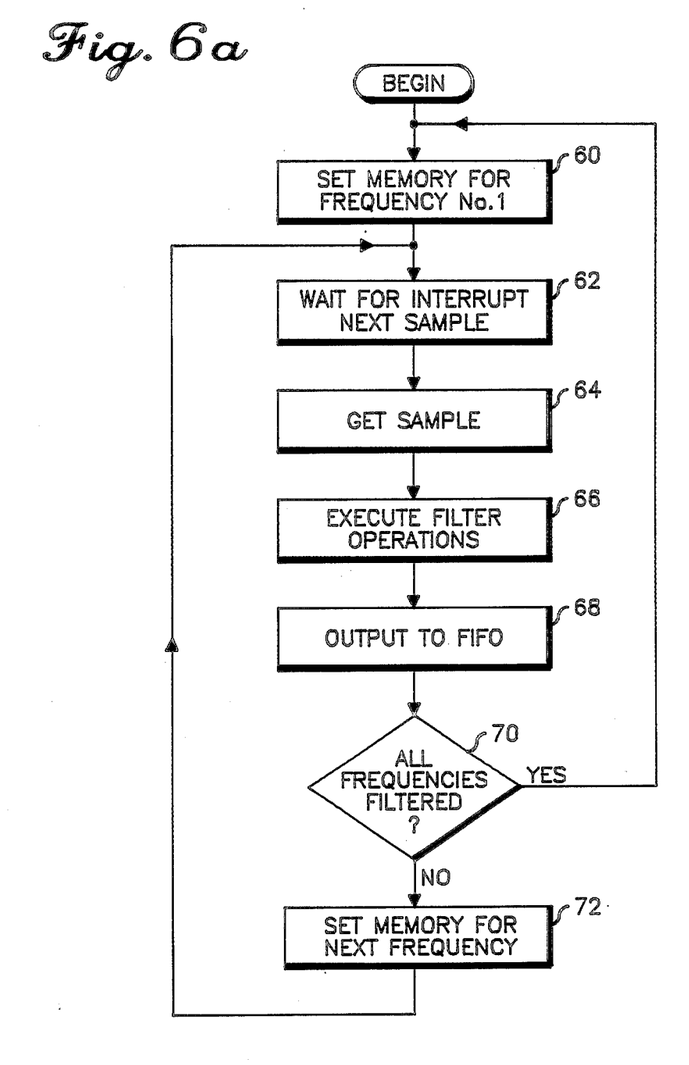
FIGS. 6a and 6b comprise a flowchart useful for better understanding the operation of a preferred embodiment of the present invention.
Figure 6B:
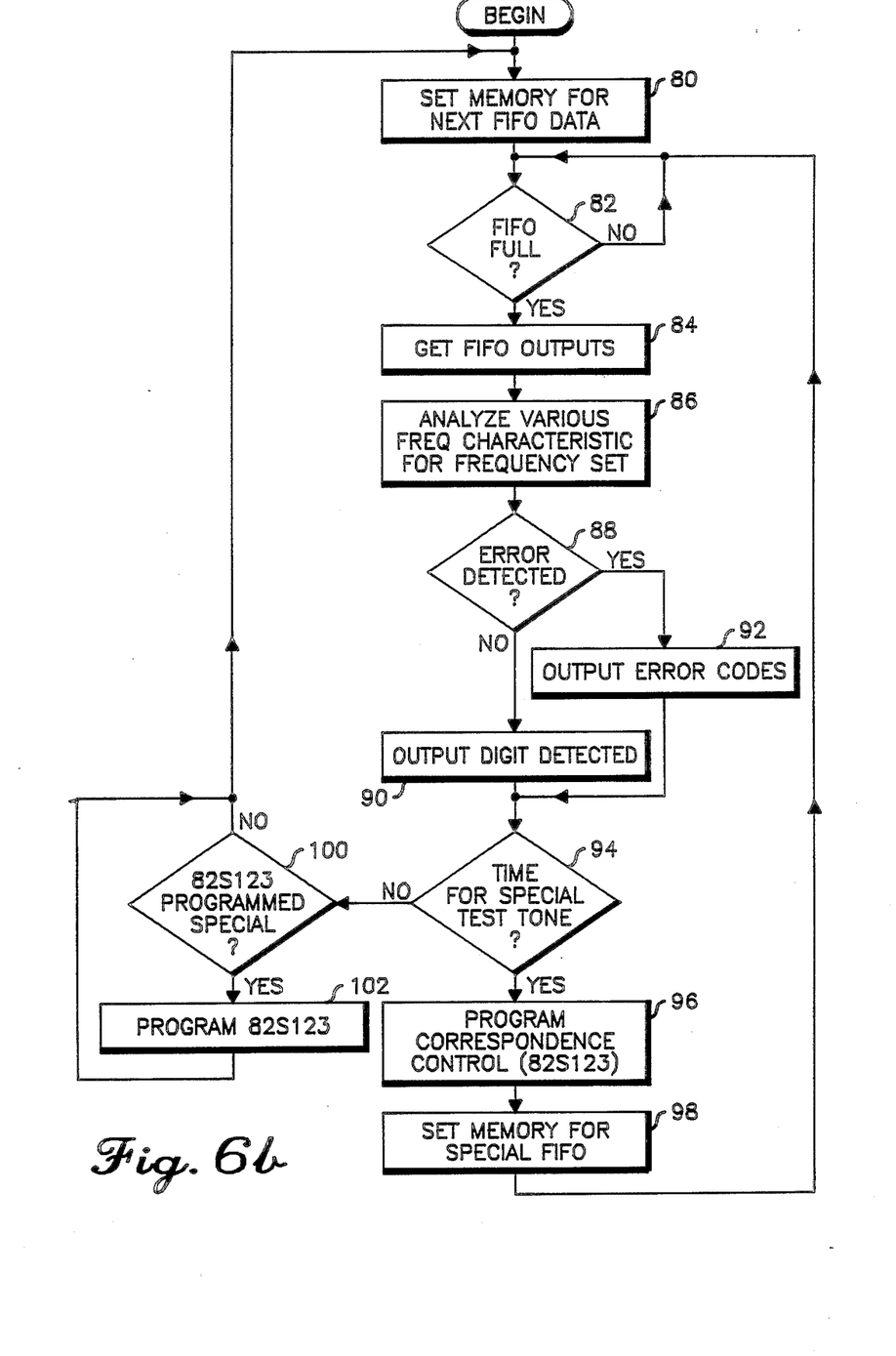

Although this type of configuration can apply to a wide variety of filtering schemes, a flowchart for the DSP 28 and a flowchart for the post-processor 34 is provided in FIG. 6(a) and (b), respectively. These flowcharts pertain only to one particular application in which each DSP is filtering for an individual set of frequencies and the post-processor 34 is determining valid digits, represented by tones, from the signals output by the DSPs. Also illustrated in the flowchart of FIG. 6(b) is an example of periodic testing done for a special test tone. It is presumed that the post-processor 34 is externally notified whenever it is time to receive special test tone information on one of the PCM channels, at which time the correspondence control 36 changes the instruction memory for the DSP to accommodate for the test tone filtering.

Referring now to FIG. 6(a), this DSP flowchart requires that memory be made available for executing filtering operations for the first frequency, block 60. The DSP waits for an interrupt signal from the multiplexer, indicating that a digital sample has been latched for that particular DSP, block 62. The latched sample is retrieved, block 64, and the DSP executes its filter operations, block 66. The filtered output is sent into a FIFO located within the DSP, block 68, for analysis by the post-processor. If all the frequencies for the DSP have been filtered, block 70, memory is again allocated for the first frequency, block 60. If all the frequencies have not been filtered, memory is allocated for the next frequency to be filtered. As long as the DSP is being interrupted for input signal samples, the DSP continues to filter and output energy levels according to the specified filter operations specified in instruction memory. Though additional intelligence can be added to this flowchart, according to previous discussion, this flowchart serves only to teach a basic implementation.

The flowchart in FIG. 6(b) displays what the post-processor does with each sample output by the DSPs. Memory is set for inputting data from the next, in this instance the first, DSP FIFO, block 80. A check is made whether the FIFO is full, block 82. The FIFO is full when all frequencies have been filtered. If all the frequencies have not been filtered, the post-processor waits. This wait is necessary in order to execute a complete analysis of frequency characteristics, block 86. Block 84 illustrates the FIFO data extracted by the post-processor. The frequency analysis is then executed on the data, block 86. After analysis, if no errors are detected, block 88, a digit or code representing the valid frequency is output to the communication system, block 90. If errors are detected, block 88, codes representing the errors are output to the communication system, block 92.

After a code is output to the communication system, a check is made whether the test tone should be filtered, block 94. If not, memory is allocated for the next DSP FIFO to be tested, block 80. If it is time to test for the special test tone, the correspondence control, preferably an 82S123, is configured by the post-processor to output address lines which align the test tone channel to the proper DSP. The proper DSP is programmed with an alternate set of filter operations to accommodate the test tone filtering, block 96. Memory is then allocated for filtering this tone, block 98. Analysis of the test tone continues until it is indicated, block 94, that the testing time has ended. After this test has ended, it is determined if the 82S123 needs to be reconfigured back to the normal filtering mode, block 100. If so, the 82S123 is reprogrammed for normal operation, block 102.

In this example, the outputs of the 82S123 can be connected either to the instruction memory of the particular DSP that is used for test tone filtering, or to both the DSP and to the multiplexer if the channel carrying the test tone must be changed to the appropriate DSP. In this instance, an external input from the communication system must inform the post-processor which channel is being used. This can be done by configuring the post-processor bus to access an external port in addition to the DSP FIFO's.

Varying forms of these flowcharts can be used to efficiently accommodate a wide variety of filtering applications using a circuit arrangement similar to that shown in FIG. 5. The programmability of this circuit arrangement allows for unlimited flexibility without incurring extra costs or reliability problems.

I claim:

1. A circuit arrangement for filtering input signals in a mult-channel pulse code modulation (PCM) system, comprising:
    (a) a plurality of digital signal processing means, each of said digital signal processing means responsive means to a start signal for receiving an input signal and each providing an output signal upon completion of one or more filtering operations;
    (b) means for multiplexing the input signals to each of said digital signal processing means, thereby establishing a distribution of the PCM channels to said filtering operations in each of said digital signal processing means;
    (c) means for analyzing frequency characteristics of said output signals from each of said plurality of digital signal processing means; and
    (d) control means for selectively controlling said distribution of the PCM channels to said filtering operations of said digital signal processing means.

2. A circuit arrangement for filtering input signals according to claim 1, wherein said output signals include codes to alert said means for analyzing said output signals.

3. A circuit arrangement for filtering input signals according to claim 1, wherein said output signals include codes representative of frequency characteristics.

4. A circuit arrangement for filtering input signals according to claim 1, wherein each said digital signal processing means includes one or more programmed set of instruction steps, each set defining at least one K cascaded M-order filtering operation.

5. A circuit arrangement for filtering input signals according to claim 1, wherein at least one of said digital signal processing means includes select signals for changing said filtering operations.

6. A circuit arrangement for filtering input signals according to claim 1, wherein each of said digital signal processing means responds to a select signal for outputting said output signals.

7. A circuit arrangement for filtering input signals according to claim 1, wherein at least one of said digital signal processing means includes signalling means for requesting the digitally coded samples of the input signals.

8. A circuit arrangement for filtering input signals according to claim 1, wherein at least one of said digital signal processing means includes means for analyzing at least one of the following frequency characteristics:

an undesired tone being present at one of the input signals, the absence of a desired tone being present at one of the input signals, and said output signals having a magnitude greater than a predetermined maximum magnitude and said output signals having a magnitude less than a predetermined minimum magnitude.

9. A circuit arrangement for filtering input signals according to claim 1, wherein each of said digital signal processing means includes means for simultaneously analyzing frequency characteristics of the input signals at a single PCM channel.

10. A circuit arrangement for filtering input signals according to claim 1, wherein said means for multiplexing the input signals includes means for translating the input signals into linear form.

11. A circuit arrangement for filtering input signals according to claim 1, wherein said means for analyzing said output signals includes means for detecting at least one of the following frequency characteristics:

at least one tone being present at one of the input signals, an absence of a desired tone being present at one of the input signals, said output signals having a magnitude greater than a predetermined maximum magnitude and said output signals having a magnitude less than a predetermined minimum magnitude, a time difference between two tones, and a difference in magnitudes between two tones.

12. A circuit arrangement for filtering input signals according to claim 1, wherein said control means includes select signals coupled to said means for multiplexing the input signals for altering said distribution.

13. A circuit arrangement for filtering input signals according to claim 1, wherein said control means includes select signals coupled to at least one of said digital signal processing means for altering said filtering operation.

14. A circuit arrangement for filtering input signals according to claim 1, wherein said control means includes select signals controlled by said means for analyzing said output signals.

15. A circuit arrangement for filter input signals in a multi-channel pulse code modulation (PCM) system, comprising:

(a) a plurality of digital signal processing means, each of said digital signal processing means responsive to a start signal for receiving an signal and each providing an output signal upon completion of one or more filtering operations;

(b) means for multiplexing the input signals to each of said digital signal processing means, each said digital signal processing means assigned to at least one PCM channel, thereby establishing a distribution of the PCM channels to said plurality of digital signal processing means; and (c) processing means for analyzing frequency characterisitics of said output signals from each of said digital signal processing means and for reassigning said distribution of the PCM channels to said plurality of digital signal processing means.

16. A circuit arrangement for filtering input signals according to claim 15, wherein said output signals include codes representative of frequency characteristics.

17. A circuit arrangement for filtering input signals according to claim 15, further including select signals input to said digital signal processing means for changing said filtering operations.

18. A circuit arrangement for filtering input signals according to claim 15, wherein each of plurality of said digital signal processing means includes means for simultaneously analyzing frequency characteristics of the input signals at a single PCM channel.

19. A circuit arrangement for filtering input signals according to claim 15, further including select signals coupled to said means for multiplexing the input signal.

20. A method for filtering input signals in a multi-channel pulse code modulation (PCM) system, the method comprising the steps of:

(a) performing simultaneous filtering operations by a plurality of digital signal processing means, each of said digital signal processing means responsive to a start signal for receiving an input signal and each providing an output signal upon completion of one or more filtering operations;

(b) multiplexing the input signals to each one of said digital signal processing means, thereby establishing a distribution of the PCM channels to said filtering operations of said digital signal processing means;

(c) analyzing said output signals from each of said digital signal processing means; and (d) selectively controlling said distribution of the PCM channels to said filtering operations of said digital signal processing means.

21. A method for filtering input signals according to claim 20, wherein said output signals include codes representative of frequency characteristics of the input signals.

22. A method for filtering input signals according to claim 20, further including the step of selecting a different said filtering operation within at least one said digital signal processing means.

23. A method for filtering input signals according to claim 20, further including the step of simultaneously analyzing frequency characteristics of an input signal at a single PCM channel.

24. A method for filtering input signals in a multi-channel pulse code modulation (PMC) system, the method comprising the steps of:

(a) performing simultaneous filtering operations by a plurality of digital signal processing means, each of said digital signal processing means responsive to a start signal for receiving an input signal and each providing an output signal upon completion of one of more filtering operations;

(b) multiplexing the input signals to each one of said digital signal processing means, each said digital signal processing means assigned to at least one PCM channel, thereby establishing a distribution of the PCM channels to said plurality of digital signal processing means;

(c) analyzing said output signals from each of said digital signals processing means; and (d) selectively reassigning said distribution of the PCM channels to said filtering operations of said digital signal processing means.

25. A circuit arrangement for filtering input signals in a multi-channel pulse code modulation (PCM) system, comprising:
   (a) a plurality of digital signal processing means, each of said digital signal processing means capable of filtering for a plurality of signalling schemes, each said digital signal processing means responsive to a start signal for receiving an input signal and each providing an output signal while filtering for one of said signalling schemes;
   (b) means for multiplexing the signals to each of said digital signal processing means, thereby establishing a distribution of the PCM channels to said digital signal processing means; and
   (c) means for analyzing frequency characteristics of said output signals from each of said plurality of digital signal processing means, and including control means for selecting which signalling scheme to employ for the PCM channels distributed to said digital signal processing means.

* * * * *

UNITED STATES PATENT AND TRADEMARK OFFICE
CERTIFICATE OF CORRECTION

PATENT NO. : 4,709,344

DATED : November 24, 1987

INVENTOR(S) : Robert J. Crawford

It is certified that error appears in the above-identified patent and that said Letters Patent is hereby corrected as shown below:

Column 10, line 26, change the word "mult-channel" to --multi-channel--.

Column 11, line 55, after the word "an" insert the word --input--.

Column 12, line 49, change the letters (PMC) to --(PCM)--.

Column 10, line 30, please delete the word "means".

Signed and Sealed this

Nineteenth Day of April, 1988

Attest:

DONALD J. QUIGG

*Attesting Officer*              *Commissioner of Patents and Trademarks*